(12) United States Patent
Wu et al.

(10) Patent No.: US 11,879,076 B1
(45) Date of Patent: Jan. 23, 2024

(54) COMPOSITION, ADHESIVE FILM AND CHIP PACKAGING STRUCTURE

(71) Applicant: Wuhan Choice Technology Co, Ltd, Wuhan (CN)

(72) Inventors: De Wu, Wuhan (CN); Shuhang Liao, Wuhan (CN); Ting Li, Wuhan (CN); Junxing Su, Wuhan (CN)

(73) Assignee: Wuhan Choice Technology Co,Ltd, Wuhan (CN)

( * ) Notice: Subject to any disclaimer, the term of this patent is extended or adjusted under 35 U.S.C. 154(b) by 0 days.

(21) Appl. No.: 18/307,765

(22) Filed: Apr. 26, 2023

Related U.S. Application Data

(63) Continuation of application No. PCT/CN2022/095569, filed on May 27, 2022.

(30) Foreign Application Priority Data

Mar. 10, 2022 (CN) .......................... 202210229157.6

(51) Int. Cl.
| | | |
|---|---|---|
| *C09J 163/00* | (2006.01) | |
| *C08L 63/00* | (2006.01) | |
| *C08G 59/38* | (2006.01) | |
| *C08G 59/62* | (2006.01) | |
| *H01L 23/29* | (2006.01) | |
| *C09J 7/30* | (2018.01) | |
| *C09J 11/04* | (2006.01) | |
| *C09J 11/06* | (2006.01) | |

(52) U.S. Cl.
CPC ............... *C09J 163/00* (2013.01); *C09J 7/30* (2018.01); *C09J 11/04* (2013.01); *C09J 11/06* (2013.01)

(58) Field of Classification Search
None
See application file for complete search history.

(56) References Cited

U.S. PATENT DOCUMENTS

2022/0169781 A1* 6/2022 Wasano ................. C08G 61/10

FOREIGN PATENT DOCUMENTS

| CN | 109476897 A | | 3/2019 | |
|---|---|---|---|---|
| CN | 111492006 A | | 8/2020 | |
| CN | 113292957 A | | 8/2021 | |
| CN | 114292615 A | | 4/2022 | |
| JP | 2003105207 A | | 4/2003 | |
| JP | 2012021086 A | * | 2/2012 | ............. C08L 63/00 |
| JP | 2019210319 A | * | 12/2019 | ............. C08G 59/20 |
| WO | WO-0220676 A1 | * | 3/2002 | ............. C09D 5/027 |

OTHER PUBLICATIONS

Machine translation of JP-2012021086-A (no date).*
Registration data of RN 110656-67-2. (Year: 1987).*

* cited by examiner

*Primary Examiner* — Michael J Feely
(74) *Attorney, Agent, or Firm* — Nitin Kaushik

(57) ABSTRACT

The present application discloses a composition, an adhesive film including the composition and a chip packaging structure. The composition includes epoxy resin, a surfactant, a curing agent and filler, wherein the surfactant is selected from a modified hexafluoropropylene compound. The surfactant in the composition is the modified hexafluoropropylene compound, the modified hexafluoropropylene compound is lower in surface energy, good in water resistance and oil resistance and capable of effectively lowering the surface tension of the composition, and therefore, when being used for preparing the adhesive film, the composition is higher in coating wettability. In, addition, the composition has stronger chemical cleaning resistance, and in a process that a residual solder flux obtained in a soldering process of a chip is cleaned, a chip protection film prepared from the composition has stronger cleaning resistance to an alkaline solution so as not to be easy to fall off.

11 Claims, 7 Drawing Sheets

COMPOSITION, ADHESIVE FILM AND CHIP PACKAGING STRUCTURE

CROSS-REFERENCE TO RELATED APPLICATIONS

The application claims priority to Chinese patent application No. CN202210229157.6, filed on Mar. 10, 2022, the entire contents of which are incorporated herein by reference.

TECHNICAL FIELD

The present application relates to the technical field of chip packaging, in particular to a composition, an adhesive film including the composition and a chip packaging structure.

BACKGROUND

With the increasingly severe competition in the industry, chip design and production companies have to continuously reduce production costs to improve market competitiveness. During chip production, hundreds to thousands or even tens of thousands of independent chips are generally made on a wafer, and then, each independent chip is cut off for subsequent production. However, during chip cutting, chips are easy to damage, which causes the reduction yield, of the chips. In the prior art, the chips on the wafer can be packaged and protected by an adhesive film before being cut, so that the chips are prevented from being damaged, and the production yield of the chips is increased.

In addition, the chips may be installed in an inversion manner during the production of semiconductors. In the inversion manner, hacks of the chips may be exposed. In order to protect the exposed backs of the chips, it is necessary to dispose a protection film on the back of each chip, and the back of the chip is protected by using the protection in.

For facilitating operation, in the prior art, a composition for an adhesive film is generally disposed on a release film to form the adhesive film combined to a surface of the release film. When a chip needs to be protected by a film during chip production and semiconductor installation, the release film on the surface of the adhesive film is removed, and the adhesive film is attached to the chip and is then cured.

A preparation method for the adhesive film generally includes: preparing the composition, coating the composition on the release film, and then, performing drying.

However, an existing composition is not good enough in coating wettability, so that the composition is not easy to attach to the release film, which increases the difficulty in preparing the adhesive film; or the prepared adhesive film is easy to separate from the release film, which affects the storage and use of the adhesive film.

In addition, during chip production, a chip needs to be chemically cleaned to remove attachments, so that a chip with a good performance is obtained. However, a chip protection film formed after an existing adhesive film is cured is poorer in chemical cleaning resistance such as alkaline solution cleaning resistance and easy to fall off from a surface of the chip during cleaning so as not to be capable of protecting the chip.

SUMMARY

To this end, the present application provides a composition for a chip protection film, which aims at relieving the problem of poor coating wettability of an existing composition for a chip protection film.

Embodiments of the present applications are implemented in such a way: provided is a composition, including epoxy resin, a surfactant, a curing agent and filler, wherein the surfactant is selected from a modified hexafluoropropylene compound.

Optionally, in some embodiments of the present application, the composition contains 40-70 parts of the epoxy resin, 0.25-1.9 parts of the surfactant, 15-35 parts of the curing agent and 30-50 parts of the filler in parts by mass.

Optionally, in some embodiments of the present application, the modified hexafluoropropylene compound includes at least one of a modified hexafluoropropylene oligomer and polyoxyethylene ether modified hexafluoropropylene.

Optionally, in some embodiments of the present application, the epoxy resin includes at least one of naphthol epoxy resin, bisphenol epoxy resin and N-[2-methyl-4-(oxiranylmethoxy)phenyl]-N-(oxiranylmethyl)oxiranemethanamine.

Optionally, in some embodiments of the present application, the epoxy resin consists of naphthol epoxy resin, bisphenol epoxy resin and N-[2-methyl-4-(oxiranylmethoxy)phenyl]-N-(oxiranylmethyl)oxiranemethanamine.

Optionally, in some embodiments of the present application, the composition contains 25-40 parts of the naphthol epoxy resin, 10-20 parts of the bisphenol epoxy resin and 5-10 parts of N-[2-methyl-4-(oxiranylmethoxy)phenyl]-N-(oxiranylmethyl)oxiranemethanamine in parts by mass.

Optionally, in some embodiments of the present application, the naphthol epoxy resin includes at least one of 1-naphthol arylalkyl epoxy resin and 1,6-naphthol arylalkyl epoxy resin;

the 1-naphthol arylalkyl epoxy resin has a structural formula shown as follows:

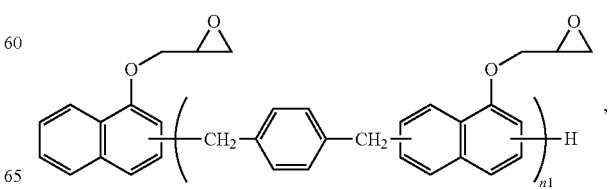

the 1,6-naphthol arylalkyl epoxy resin has a structural formula shown as follows:

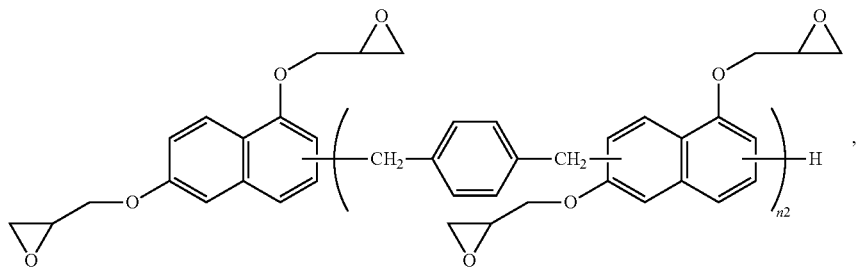

wherein n1 is an integer greater than or equal to 5 and less than or equal to 10, and n2 is an integer greater than or equal to 5 and less than or equal to 10.

Optionally, in some embodiments of the present application, the bisphenol epoxy resin includes at least one of bisphenol-F epoxy resin, bisphenol-A epoxy resin, bisphenol-IF/A copolymerized epoxy resin and bisphenol-S epoxy resin.

Optionally, in some embodiments of the present application, the curing agent includes at least one of 1-hydroxynaphthyl aralkyl resin and 1,6-dihydroxynaphthyl aralkyl resin:

the 1-hydroxynaphthyl aralkyl resin has a structural formula shown as follows:

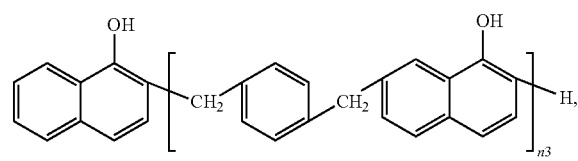

the 1,6-dihydroxynaphthyl aralkyl resin has a structural formula shown as follows:

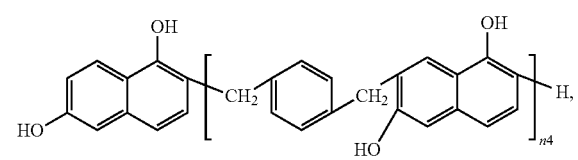

wherein n3 is an integer greater than or equal to 5 and less than or equal to 10, and n4 is an integer greater than or equal to 5 and less than or equal to 10.

Optionally, in some embodiments of the present application, the filler includes at least one of silica, calcium carbonate, aluminum oxide and diatomite.

Optionally, in some embodiments of the present application, the composition further includes an accelerator, and the composition contains 0.5-5 parts of the accelerator in parts by mass; and/or the composition further includes a colorant, and the composition contains 1-5 parts of the colorant in parts by mass; and/or the composition further includes a solvent, and the composition contains 85-170 parts of the solvent in parts by mass.

Optionally, in some embodiments of the present application, the accelerator includes at least one of boron trifluoride triethylphosphine, boron trifluoride triisopropylphosphine, cyclotriphosphine, a phosphoramine compound, trimethylphosphine, triphenylphosphine and derivatives thereof; and/or the colorant is selected from carbon black; and/or the solvent is selected from at least one of propylene glycol monomethyl ether acetate, ethyl acetate, butyl acetate, cyclohexanone, methyl isobutyl ketone and diethylene glycol monoethyl ether.

Correspondingly, an embodiment of the present application further provides an adhesive film, wherein the adhesive film includes the above-mentioned composition, or the adhesive film is prepared from the above-mentioned composition.

Correspondingly, an embodiment of the present application further provides a chip packaging structure, including a chip and a chip protection film combined to one surface of the chip, wherein the chip protection film is formed after the above-mentioned composition is cured, or the chip protection film is formed after the above-mentioned adhesive film is cured.

Optionally, in some embodiments of the present application, the chip includes a substrate and a silver layer located on one surface of the substrate, and the chip protection film is combined to a surface, away from the substrate, of the silver layer.

The surfactant in the composition provided by the present application is the modified hexafluoropropylene compound, the modified hexafluoropropylene compound is lower in surface energy, good in water resistance and oil resistance and capable of effectively lowering the surface tension of the composition, and therefore, when being used for preparing the adhesive film, the composition is higher in coating wettability and easy to attach to a release film. In addition, the composition has stronger chemical cleaning resistance, and in a process that a residual solder flux obtained in a soldering process of a chip is cleaned, the chip protection film prepared from the composition has stronger cleaning resistance to an alkaline solution so as not to be easy to fall off.

BRIEF DESCRIPTION OF DRAWINGS

In order to describe the technical solutions in the embodiments of the present application more clearly, the accompanying drawings required for describing the embodiments will be briefly introduced below. Apparently, the accompanying drawings in the following description show only some embodiments of the present application, and those skilled in the art may still derive other accompanying drawings from these accompanying drawings without creative efforts.

DETAILED DESCRIPTION OF THE EMBODIMENTS

Figure 1:
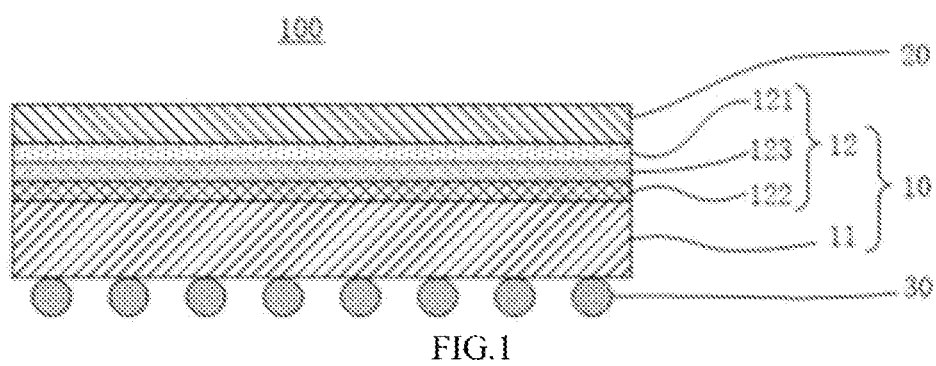
FIG. 1 is a schematic structural diagram of a chip packaging structure provided in an embodiment of the present application.

The technical solutions in the embodiments of the present application will be clearly and completely described below in combination with the accompanying drawings in the embodiments of the present application. Apparently, the described embodiments are only a part of the embodiments of the present application, but not all of the embodiments. Based on the embodiments of the present application, all other embodiments obtained by those skilled in the art without creative effort shall fall within the protection scope of the present application. In addition, it should be understood that the specific implementations described herein are merely intended to describe and explain the present application, rather than to limit the present application.

In the present application, the term "including" refers to "including, but not limited to", Terms such as first, second and third are merely intended to be used as marks, rather than to impose numerical requirements or establish an order.

Various embodiments of the present application can exist in a form of a range. It should be understood that the description in a form of a range is only for the purposes of convenience and simplicity and should not be understood as an inflexible limitation on the scope of the present application. Therefore, it should be considered that all possible sub-ranges and a single value in the range have been specifically disclosed in the description for the range. For example, it should be considered that sub-ranges such as 1-3, 1-4, 1-5, 2-4, 2-6 and 3-6 and a single number such as 1, 2, 3, 4, 5 and 6 within a range to which the single number belongs have been specifically disclosed in the description for the range from 1 to 6, and it is applicable regardless of the range. In addition, a value range indicated herein refers to any referenced numbers (fractions or integers) within the referred range.

In the present application, an epoxy equivalent refers to the gram (g/eq) of resin containing 1 equivalent of epoxy groups.

In the present application, a hydroxyl equivalent refers to the gram (g/eq) of a naphthol curing agent containing 1 equivalent of hydroxyls.

In the present application, spherical silica means that the particles of silica are spherical or similarly spherical.

An embodiment of the present application provides a composition mainly used for preparing an adhesive film. The composition includes epoxy resin, a surfactant, a curing agent and filler, wherein the surfactant is selected from a modified hexafluoropropylene compound.

The modified hexafluoropropylene compound may be selected from, but is not limited to at least one of a modified hexafluoropropylene oligomer and polyoxyethylene ether modified hexafluoropropylene. The modified hexafluoropropylene compound is lower in surface energy, good in water resistance and oil resistance and capable of effectively lowering the surface tension of the composition, and therefore, when being used for preparing the adhesive film, the composition is higher in coating wettability and easy to attach to a release film and particularly attach to a PET silicon-based release fin.

The composition contains 40-70 parts of the epoxy resin, 0.25-1.9 parts of the surfactant, 15-35 parts of the curing agent and 30-50 parts of the filler in parts by mass.

The epoxy resin may be selected from, but is not limited to at least one of naphthol epoxy resin, bisphenol epoxy resin and N-[2-methyl-4-(oxiranylmethoxy)phenyl]-N-(oxiranylmethyl)oxiranemethanamine.

In at least some embodiments, the epoxy resin includes naphthol epoxy resin, bisphenol epoxy resin and N-[2-methyl-4-(oxiranylmethoxy)phenyl]-N-(oxiranylmethyl) oxiranemethanamine at the same time. Further, the composition contains 25-40 parts of the naphthol epoxy resin, 10-20 parts of the bisphenol epoxy resin and 5-10 parts of N-[2-methyl-4-(oxiranylmethoxy)phenyl]-N-(oxiranylmethyl)oxiranemethanamine.

The naphthol epoxy resin may be selected from, but is not limited to at least one of 1-naphthol arylalkyl epoxy resin and 1,6-naphthol arylalkyl epoxy resin.

The 1-naphthol arylalkyl epoxy resin has a structural formula shown as follows:

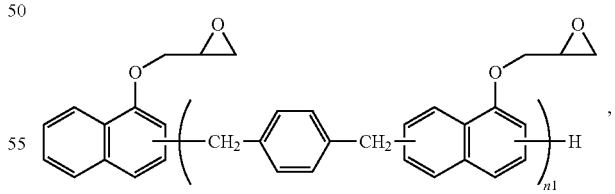

wherein n1 is an integer greater than or equal to 5 and less than or equal to 10.

In at least some embodiments, the 1-naphthol arylalkyl epoxy resin, is resin ESN-475V purchased from Nippon Steel & Sumikin Chemical Co., Ltd.

In some embodiments, an epoxy equivalent of the 1-naphthol arylalkyl epoxy resin is 310-350 g/eq.

The 1,6-naphthol arylalkyl epoxy resin has a structural formula shown as

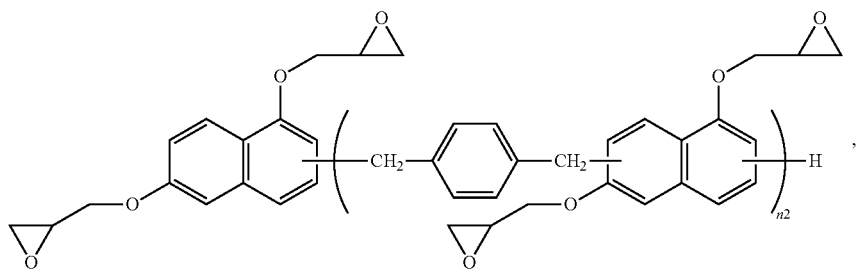

wherein n2 is an integer greater than or equal to 5 and less than or equal to 10.

In at least some embodiments, the 1,6-naphthol arylalkyl epoxy resin is resin ESN-375 purchased from Nippon Steel & Sumikin Chemical Co., Ltd.

In some embodiments, an epoxy equivalent of the 1,6-naphthol arylalkyl epoxy resin is 160-180 g/eq.

The 1-naphthol arylalkyl epoxy resin and the 1,6-naphthol arylalkyl epoxy resin have strong hydrophobicity, low moisture absorption property, low expansion coefficient and strong flame retardance. Due to the strong hydrophobicity and the low moisture absorption property, the water resistance of the composition can be further improved. In addition, the 1-naphthol arylalkyl epoxy resin and the 1,6-naphthol arylalkyl epoxy resin may introduce naphthalene rings which are not easy to rotate, so that the composition is stronger in cohesion and better in molecular orientation, and a chip protection film formed from the composition has very good thermal resistance, moisture resistance, chemical resistance and stability.

The bisphenol epoxy resin may be selected from, but is not limited to at least one of bisphenol-F epoxy resin, bisphenol-A epoxy resin, bisphenol-F/A copolymerized epoxy resin and bisphenol-S epoxy resin. The bisphenol epoxy resin can make the crystallinity of the composition during curing low, thereby making a film layer obtained after curing have a good surface appearance.

In some embodiments, the bisphenol epoxy resin is selected from the bisphenol-F/A copolymerized epoxy resin.

In at least some embodiments, the bisphenol-F/A copolymerized epoxy resin is selected from resin EpoTohto ZX-1059 purchased from Nippon Steel & Sunikin Chemical Co., Ltd.

In some embodiments, an epoxy equivalent of the bisphenol-F/A copolymerized epoxy resin is 160-170 g/eq.

It can be understood that the bisphenol epoxy resin may adopt any one of a liquid, a solid or a semisolid in the present application.

N-[2-methyl-4-(oxiranylmethoxy)phenyl]-N-(oxiranylmethyl)oxiranemethanamine ne is liquid epoxy resin which can effectively increase the glass transition temperature of the composition.

N-[2-methyl-4-(oxiranylmethoxy)phenyl]-N-(oxiranylmethyl)oxiranemethanamine ne has a structural formula shown as follows:

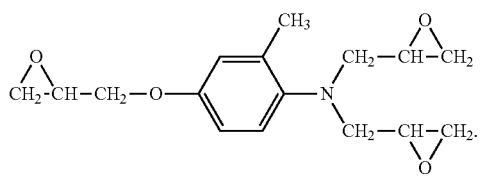 [SMILES: Cc1cc(OCC2CO2)ccc1N(CC1CO1)CC1CO1]

In some embodiments an epoxy equivalent of N-[2-meptyl-4-(oxiranylmethoxy)phenyl]-N-(oxiranylmethyl)oxiranemethanamine is 100-110 g/eq.

The curing agent is selected from a naphthol curing agent. The naphthol curing agent may be selected, but is not limited to at least one of 1-hydroxynaphthyl aralkyl resin and 1,6-dihydroxynaphthyl aralkyl resin.

In some embodiments, the 1-hydroxynaphthyl aralkyl resin is i-hydroxynaphthyl aralkyl resin EpoTohto ESN-485 purchased from Nippon Steel & Sumikin Chemical Co., Ltd, and has a structural formula shown as follows:

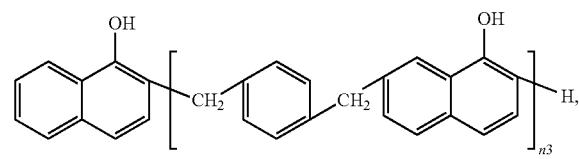

wherein n3 is an integer greater than or equal to 5 and less than or equal to 10.

In some embodiments, a hydroxyl equivalent of the 1-hydroxynaphthyl aralkyl resin is 205-225 g/eq. Within a range of the hydroxyl equivalent, the resin obtained after the composition is cured can have good thermal resistance and moisture resistance.

In some embodiments, the 1,6-dihydroxynaphthyl aralkyl resin is resin EpoTohto ESN-395 purchased from Nippon Steel & Sumikin Chemical Co., Ltd., and has a structural formula shown as follows:

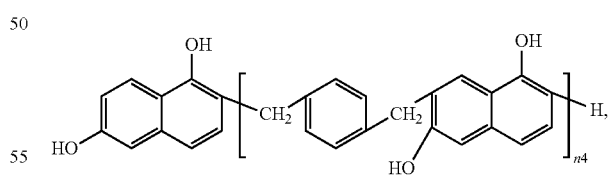

wherein n4 is an integer greater than or equal to 5 and less than or equal to 10.

In some embodiments, a hydroxyl equivalent of the 1,6-dihydroxynaphthyl aralkyl resin is 100-120 g/eq. Within a range of the hydroxyl equivalent, the resin obtained after the composition is cured can have good thermal resistance and moisture resistance.

In some embodiments, the filler may be selected from, but is not limited to at least one of silica, calcium carbonate, aluminum oxide and diatomite.

In some embodiments, a, particle size of the filler is 0.1-100 µm.

In at least some embodiments, the filler is selected from spherical silica of which the particle size is D50. The spherical silica is good in film forming and insulating properties and beneficial to improvement on a thermal expansion coefficient of the resin obtained after the composition is cured.

In some embodiments, the composition further includes an accelerator. The composition contains 0.5-5 parts of the accelerator in parts by mass.

The accelerator in the present application is a curing accelerator and is used for increasing a rate of reaction between the curing agent and, each of the naphthol epoxy resin, the bisphenol epoxy resin and N-[2-methyl-4-(oxiranylmethoxy)phenyl]-N-(oxiranylmethyl)oxiranemethanamine, increasing the curing efficiency, controlling the curing time of the composition and increasing the production efficiency.

In some embodiments, the accelerator may be selected from a phosphorus curing accelerator. The phosphorus curing accelerator may be selected from, but is not limited to at least one of boron trifluoride triethylphosphine, boron trifluoride triisopropylphosphine, cyclotriphosphine, a phosphoramine compound, trimethylphosphine, triphenylphosphine and derivatives thereof.

In at least some embodiments, the accelerator is selected from trimethylphosphine.

In some embodiments, the composition further includes a colorant. The composition contains 1-5 parts of the colorant in parts by mass.

In some embodiments, the colorant is selected from carbon black. In some embodiments, the particle size of the carbon black is 10-50 nm. In at least one embodiment, the particle size of the carbon black is 25 nm.

In some embodiments, the composition further includes a solvent. The composition contains 85-170 parts of the solvent in parts by mass.

The solvent may be selected from, but is not limited to at least one of propylene glycol monomethyl ether acetate, ethyl acetate, butyl acetate, cyclohexanone, methyl isobutyl ketone and diethylene glycol monoethyl ether.

The composition may undergo a curing reaction at the temperature of 150-165° C.

The surfactant in the composition provided by the present application is the modified hexafluoropropylene compound, the modified hexafluoropropylene compound is lower in surface energy, good in water resistance, and oil resistance and capable of effectively lowering the surface tension of the composition, and therefore, when being used for preparing the adhesive film, the composition is higher in coating wettability and easy to attach to a release film and particularly attach to a PET silicon-based release film. In addition, in a process that a residual solder flux obtained after a soldering process of a chip of a chip protection film prepared from the composition is cleaned, the chip protection film has stronger cleaning resistance to an alkaline solution so as not to be easy to fall off.

An embodiment of the present application further provides a preparation method for a composition, including the following steps:

step S01: an epoxy resin solution is provided:

step S02: filler is added into the epoxy resin solution and is mixed at a first temperature to obtain a first mixture;

step S03: a curing agent is added into the first mixture and is mixed at a second temperature to obtain a second mixture; and step S04: a surfactant is added into the second mixture and is mixed at a third temperature to obtain the composition.

In some embodiments, the composition includes naphthol epoxy resin, bisphenol epoxy resin and N-[2-methyl-4-(oxiranylmethoxy)phenyl]-N-(oxiranylethyl)oxiranemethanamine at the same time. At the moment, step S01 includes: naphthol epoxy resin, bisphenol epoxy resin and N-[2-methyl-4-(oxiranylmethoxy)phenyl]-N-(oxiranylmethyl)oxiranemethanamine are provided and are mixed at a fourth temperature to obtain the epoxy resin solution.

In some embodiments, the composition further includes a solvent, at the moment, step S01 includes: epoxy resin is provided and is dissolved into the solvent to obtain the epoxy resin solution.

In some embodiments, the composition further includes a colorant, at the moment, before mixing at the first temperature is performed in step S02, step S02 further includes: the colorant is added into the epoxy resin solution.

In some embodiments, the composition further includes an accelerator, at the moment, before mixing at the second temperature is performed in step S03, step S03 further includes: the accelerator is added into the first mixture.

In some embodiments, in step S04, a step that the composition is defoamed in a defoaming machine is further included.

In at least some embodiments, defoamation means that a vacuum pump is adopted to vacuumize until a negative pressure in, a cylinder body is lower than or equal to −0.95 Mpa, and then, defoamation is performed until there are no air bubbles in the composition.

The naphthol epoxy resin, the bisphenol epoxy resin, the surfactant, the filler, the curing agent, the colorant, the accelerator and the solvent refer to those mentioned above, the descriptions thereof are omitted herein.

In some embodiments, the first temperature is within a range of 95-140° C. In the temperature range, the filler may be uniformly and rapidly dispersed in the epoxy resin solution, and if the temperature is excessively high, resin in the epoxy resin solution may undergo crosslinking reaction, and thus, the composition provided by the present application cannot be prepared.

In some embodiments, the second temperature is within a range of 25-40° C., If the temperature is lower than the temperature range, it is not easy to achieve uniform mixing due to excessively high viscosity and if the temperature is higher than the temperature range, a curing reaction is easy to occur.

In some embodiments, the third temperature is a room temperature.

In some embodiments, the fourth temperature is within a range of 95-140° C. In the temperature range, not only can the naphthol epoxy resin be rapidly dissolved into the bisphenol epoxy resin and N-[2-methyl-4-(oxiranylmethoxy)phenyl]-N-(oxiranylmethyl)oxiranemethanamine, but also the crosslinking reaction of the resin in the composition due to excessively high temperature can be avoided.

In some embodiments, the time of mixing at the first temperature is 10-180 min.

In some embodiments, the time of mixing at the second temperature is 10-60 min.

In some embodiments, the time of mixing at the third temperature is 15-30 min.

In some embodiments, the time of mixing at the fourth temperature is 10-180 min.

It can be understood that the mixing may be a method, such as stirring-mixing, used for mixing the composition all the time in the art. In at least one embodiment, the mixing is performed in a planetary mixer.

Figure 3:
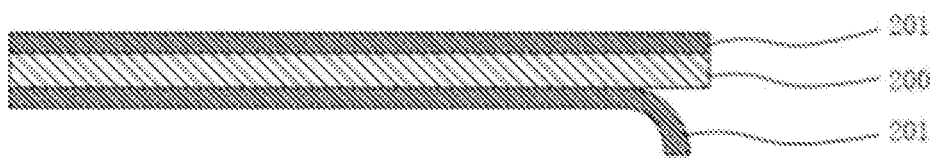
FIG. 3 is a schematic structural diagram of an adhesive film provided in an embodiment of the present application.

Refer to FIG. 3, an embodiment of the present application further provides an adhesive film 200. The adhesive film 200 includes the composition, or the adhesive film 200 is prepared from the composition.

In some embodiments, two opposite surfaces of the adhesive film 200 are provided with release films 201, so that it is convenient to store and transport the adhesive film 200.

Each of the release films may be selected from a PET film, a PE film, a silicon-based release film, etc. according to types pf materials. In at least one embodiment, a base material is selected from the silicon-based release film.

The adhesive film 200 includes the composition so as to be lower in surface tension and stronger in adhesion, temperature resistance, moisture resistance and chemical cleaning resistance, a chip protection film formed by curing during chip production is combined to a surface of a chip and is not easy to fall off in a process that a residual solder flux obtained after a soldering process of the chip is cleaned, so that the chip can be effectively protected for a long time, and then, the performance of a semiconductor device is improved.

An embodiment of the present application further provides a preparation method for an adhesive film 200, including the following steps:

step S11: the composition is provided; and step S12: the composition is flattened and dried to obtain the adhesive film 200.

It should be noted that "flattening" described herein means that a film layer with an even surface is enabled to be formed from the composition, which may specifically include: the composite is coated on the base material to form the film layer with the even surface.

The base material may be selected from the release films 201.

In some embodiments, the drying means that drying is performed at 120-140° C. for 0,5-2 min to remove the solvent in the composition. It should be noted that the drying time is shorter, which can avoid the curing reaction of the composition.

When the adhesive film 20 is used to protect a chip, firstly, the release films 201 on the surfaces of the adhesive film 200 are removed, and the adhesive film 200 is attached to a surface of the chip and is then thermally cured at the temperature of 150-165° C. to obtain a chip protection film combined to the surface of the chip.

Figure 2:
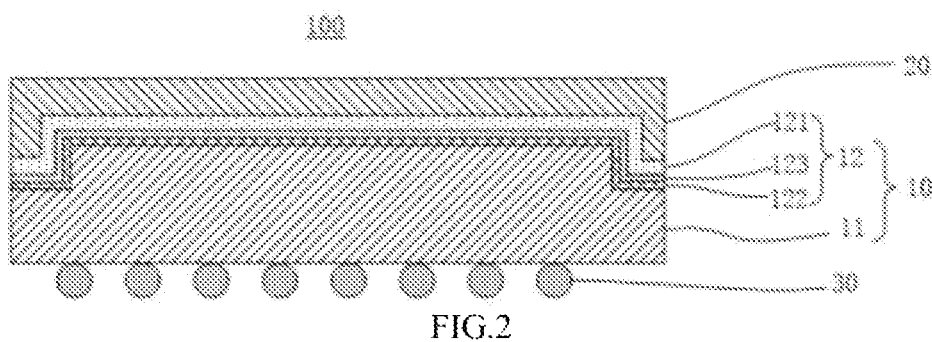
FIG. 2 is a schematic structural diagram of another chip packaging structure provided in an embodiment of the present application.

Refer to FIG. 1 to FIG. 2, the present application further provides a chip packaging structure 100, including a chip 10 and a chip protection film 20 combined to one surface of the chip 10. The chip protection film 20 is formed after the composition is cured, or the chip protection film 20 is formed after the adhesive film 200 is cured.

The chip protection film 20 may be used to protect the chip 10 during wafer cutting, solder flux cleaning, and use of the chip 10.

In some embodiments, the curing temperature is within a range of 150-165° C.

In some embodiments, the chip 10 includes a substrate 11 and an electromagnetic shielding layer 12 combined to one surface of the substrate 11. The electromagnetic shielding layer 12 includes a silver layer 121, and the chip protection film 20 is combined to a surface, away from the substrate II, of the silver layer 121. The chip protection film 20 is not easy to fall off from the surface of the silver layer 121 of the chip 10 due to stronger adhesion to a silver surface, thereby effectively protecting the chip 10 for a long time, and then, improving the performance of a semiconductor device including the chip 10. In addition, the chip protection film 20 is further stronger in chemical cleaning resistance and is not easy to fall off in a process that a residual solder flux obtained after a soldering process of the chip 10 is cleaned, thereby effectively protecting the chip 10 for a long time, and then, improving the performance of a semiconductor device including the chip 10.

In some embodiments, the electromagnetic shielding layer 12 further includes a titanium layer 122 and a nickel layer 123 which are sequentially combined to the surface of the substrate 11, and the silver layer 121 is combined to a, surface, away from the substrate 11, of the nickel layer 123.

It can be understood that the substrate 11 may be a silicon-based substrate, etc. known to be used for the chip.

In some embodiments, the chip packaging structure 100 further includes a plurality of solder bumps 30 disposed on a surface, away from the chip protection film 20, of the chip 10. The solder bumps 30 are used for soldering the chip 10 on a base plate.

Refer to FIG. 1, in some embodiments, the surface, combined with the chip protection film 20, of the chip 10 is an even surface.

Refer to FIG. 2, in some other embodiments, the surface, combined with the chip protection film 20, of the chip 10 is an uneven surface. For example, in some embodiments, the surface, combined with the chip protection film 20, of the chip 10 is provided, with a convex area and a concave area. In other words, a section, facing the substrate 11 along the chip protection film 20, of the chip 10 is shaped like a Chinese character "ji".

In some embodiments, the chip 10 is an MOSFET (Metal-Oxide Semiconductor Field Effect Transistor) chip.

The chip protection film 20 in the chip packaging structure 100 is prepared after the composition in the present application is cured, the surfactant in the composition is the modified hexafluoropropylene compound, and the modified hexafluoropropylene compound is lower in surface energy, good in water resistance and oil resistance and capable of effectively lowering the surface tension of the composition, and therefore, the chip protection film 20 is not easy to fall off from the chip 10 due to stronger adhesion, temperature resistance, moisture and chemical cleaning resistance, thereby effectively protecting the chip 10 for a long time, and then, improving the performance of a semiconductor device including the chip 10.

Refer to FIG. 3 to FIG. 7, the use of the adhesive film 200 and chip protection from the chip protection film 20 will be described as below.

Refer to FIG. 3, the adhesive film 200 is provided, and the release film 201 on one surface of the adhesive film 200 is removed.

Figure 4:
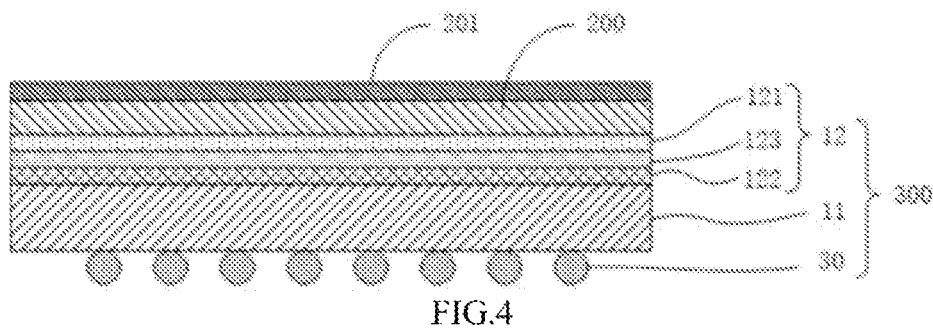
FIG. 4 is a schematic diagram showing that the adhesive film shown in FIG. 3 is attached to a surface of a wafer.

Refer to FIG. 4, a wafer 300 is provided, the wafer 300 includes a substrate 11 as well as the electromagnetic shielding layer 12 and the plurality of solder bumps 30 respectively disposed on the two opposite surfaces of the substrate 11, the electromagnetic shielding layer 12 includes the titanium layer 122, the nickel layer 123 and the silver layer 121 which are sequentially stacked on the surface of the substrate 11, and the adhesive film 200 is attached to a surface, away from the substrate 11, of the silver layer 121.

Figure 5:
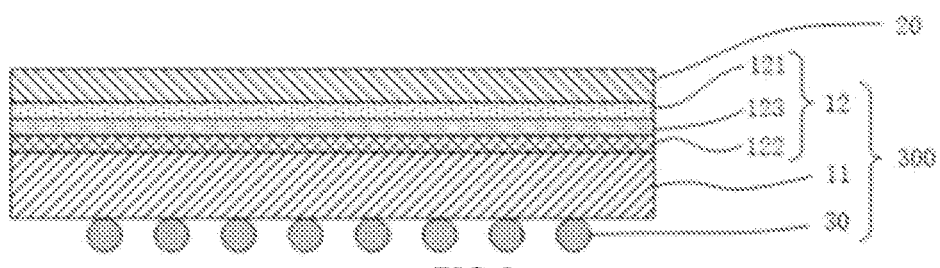
FIG. 5 is a schematic diagram showing that a release film shown in FIG. 4 is removed and the adhesive film is cured to form a, chip protection film.

Refer to FIG. 5, the release film 201 combined to the other surface of the adhesive film 200 is removed, and then, heating is performed at 150° C., so that the adhesive film 200 is cured to form the chip protection film 20.

Figure 6:
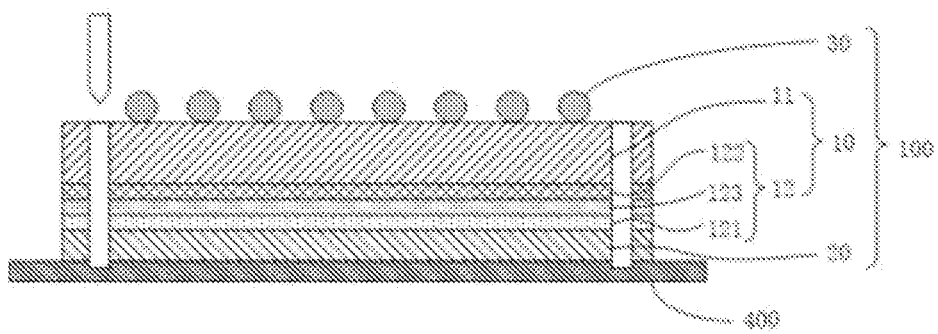
FIG. 6 is a schematic diagram showing that the wafer shown in FIG. 5 is cut.

Refer to FIG. 6, the wafer 300 combined with the chip protection film 20 is placed on a cutting plate 400, and the chip protection film 20 is enabled to be in direct contact with the cutting plate 400 to cut the wafer 300, so that the chip packaging structure 100 is obtained. The chip packaging structure 100 includes the chip 10 as well as the chip protection film 20 and the plurality of spaced solder bumps 30 respectively combined to the two opposite surfaces of the chip 10.

Figure 7:
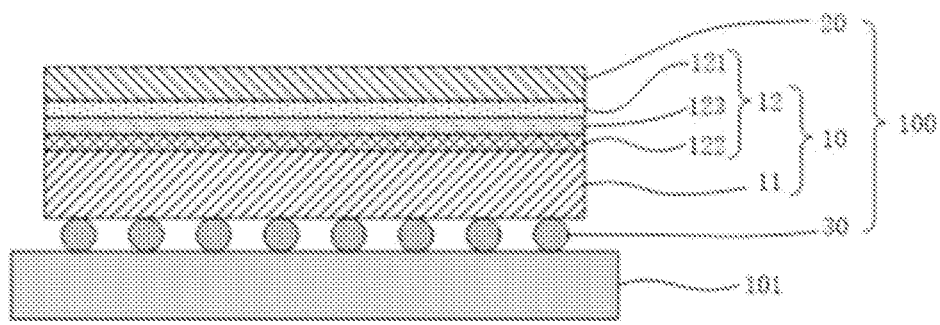
FIG. 7 is a schematic diagram showing that a chip obtained by cutting in FIG. 6 is soldered on a base plate.

Refer to FIG. 7, a solder flux is used to solder the chip 10 on a base plate 101 by virtue of the solder bumps 30, and then, the residual solder flux on the chip 10 is cleaned by using an alkaline solution.

The chip protection film 20 is prepared from the adhesive film 200 to achieve stronger adhesion, temperature resistance, moisture resistance and chemical cleaning resistance, and therefore, it is not easy to fall off from the chip 10 in a process that the wafer 300 is cut and the solder flux is cleaned, thereby effectively protecting the chip 10 for a long time.

The present application will be specifically described with specific embodiments as below, and the following embodiments are only parts of embodiments of the present application, rather than limitations on the present application.

It should be noted that:

in the following specific embodiments, an adopted modified hexafluoropropylene oligomer is purchased from Japanese NEOS Co., Ltd., its model is 710FM, and its weight-average molecular weight is 588;

in the following specific embodiments, adopted polyoxyethylene ether modified hexafluoropropylene is purchased from Japanese NEOS Co., Ltd, its model is DFX-18, and its weight-average molecular weight is 2200;

in the following specific embodiments, adopted 1-naphthol arylalkyl epoxy resin is purchased from Nippon Steel & Sumikin Chemical Co., Ltd., its model is ESN-475V, and its epoxy equivalent is 310-350 g/eq;

in the following specific embodiments, adopted 1,6-naphthol arylalkyl epoxy resin is purchased from Nippon Steel & Sumikin Chemical Co, Ltd., its model is ESN-375, and its epoxy equivalent is 160-180 g/eq;

in the following specific embodiments, adopted, bisphenol-F/A copolymerized epoxy resin is purchased from Nippon Steel & Sumikin Chemical Co., Ltd., its model is EpoTohto ZN-1059, and its epoxy equivalent is 160-170 g/eq;

in the following specific embodiments, adopted N-[2-methyl-4-(oxiranylmethoxy)phenyl]-N-(oxiranylmethyl)oxiranemethanamine is purchased from Sumitomo Chemical Co., Ltd., its model is Sumi-Epoxy ELM-100H, and its epoxy equivalent is 104 g/eq; and in the following specific embodiments, adopted 1-hydroxynaphthyl aralkyl resin serving as a curing agent is purchased from Nippon Steel & Sumikin Chemical Co., Ltd., its model is EpoTohto ESN-485, and its epoxy equivalent is 205-225 g/eq.

Embodiment I

Preparation of Composition 1-naphthol arylalkyl epoxy resin, bisphenol-F/A copolymerized epoxy resin and N-[2-methyl-4-(oxiranylmethoxy)phenyl]-N-(oxiranylmethyl)oxiranemethanamine are added into a planetary stirrer and are stirred at 140° C. for 30 min;

molten spherical silica and carbon black are added into the planetary stirrer and are stirred at 95° C. for 60 min;

1-hydroxynaphthyl aralkyl resin and triphenylphosphine are added into the planetary stirrer and are stirred at 40° C. for 30 min; and a modified hexafluoropropylene oligomer is added into the planetary stirrer and is further stirred at a normal temperature for 15 min to obtain a composition.

The composition contains 35 parts of 1-naphthol arylalkyl epoxy resin, 12 parts of bisphenol-F/A copolymerized epoxy resin, 5 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0.6 part of modified hexafluoropropylene oligomer in parts by mass.

Preparation of Slurry the composition is dissolved into a solvent PMA to obtain slurry, wherein the slurry contains 50 wt % of the composition and 50 wt % of PMA.

Preparation of Adhesive Film the slurry is coated on a silicon-based release film and is dried at 120° C. for 1min to obtain an adhesive film combined to a surface of the silicon-based release film, and the other surface of the adhesive film is attached to the other silicon-based release film.

Embodiment 2

The present embodiment is basically the same as embodiment 1 except that the composition in the present embodiment includes 35 parts of 1-naphthol arylalkyl epoxy resin, 12 parts of bisphenol-F/A copolymerized epoxy resin, 5 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 1 part of modified hexafluoropropylene oligomer in parts by mass.

Embodiment 3

The present embodiment is basically the same as embodiment 1 except that the modified hexafluoropropylene oligomer in embodiment 1 is replaced with polyoxyethylene ether modified hexafluoropropylene.

The composition in the present embodiment includes 35 parts of 1-naphthol arylalkyl epoxy resin, 12 parts of bisphenol-F/A copolymerized epoxy resin, 5 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0,6 part of polyoxyethylene ether modified hexafluoropropylene in parts by mass.

Embodiment 4

The present embodiment is basically the same as embodiment 3 except that the composition in the present embodiment includes 35 parts of 1-naphthol arylalkyl epoxy resin, 12 parts of bisphenol-F/A copolymerized epoxy resin, 5 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 1.0 part of polyoxyethylene ether modified hexafluoropropylene in parts by mass.

Embodiment 5

The present embodiment is basically the same as embodiment 3 except that the composition in the present embodiment includes 40 parts of 1-naphthol arylalkyl epoxy resin, 20 parts of bisphenol-F/A copolymerized epoxy resin, 10 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0.6 part of polyoxyethylene ether modified hexafluoropropylene in parts by mass.

Embodiment 6

The present embodiment is basically the same as embodiment 3 except that the composition in the present embodiment includes 30 parts of 1-naphthol arylalkyl epoxy resin, 10 parts of bisphenol-F/A copolymerized epoxy resin, 1 part of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0.6 part of polyoxyethylene ether modified hexafluoropropylene in parts by mass.

Embodiment 7

The present embodiment is basically the same as embodiment 1 except that 1-naphthol arylalkyl epoxy resin in embodiment 1 is replaced with 1,6-naphthol arylalkyl epoxy resin adopted in the present embodiment.

Comparative Example 1

The comparative example is basically the same as embodiment 1 except that the composition in the present comparative example does not include the modified hexafluoropropylene oligomer.

Comparative Example 2

The comparative example is basically the same as embodiment 1 except that the composition in the present comparative example does not include the 1-naphthol arylalkyl epoxy resin.

Comparative Example 3

The comparative example is basically the same as embodiment 1 except that the composition in the present comparative example does not include the bisphenol-F/A copolymerized epoxy resin.

Comparative Example 4

The comparative example is basically the same as embodiment 1 except that the composition in the present comparative example does not include N-[2-methyl-4-(oxiranylethoxy)phenyl]-N-(oxiranylethyl)oxiranemethanamine.

Comparative Example 5

The comparative example is basically the same as embodiment 1 except that the composition in the present comparative example includes a polyether and organic siloxane copolymer (Texas Chemical Doxflow 8500) serving as a surfactant.

Comparative Example 6

The comparative example is basically the same as embodiment 1 except that the composition in the present comparative example includes 35 parts of 1-naphthol arylalkyl epoxy resin, 12 parts of bisphenol-F/A copolymerized epoxy resin, 5 parts of N-[2-methyl-4-(oxiranylmethoxy)phenyl]-N-(oxiranylethyl)oxiranemethanamine, 25 parts of 1-hydroxynaphthyl aralkyl resin, 1 part of triphenylphosphine, 2 parts of carbon black, 32 parts of spherical silica and 2 parts of modified hexafluoropropylene oligormers in parts by mass.

Comparative Example 7

The comparative example is basically the same as embodiment 1 except that the composition in the present comparative example includes 40 parts of 1-naphthol arylalkyl epoxy resin, 20 parts of bisphenol-F/A copolymerized epoxy resin, 10 parts of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0.2 part of modified hexafluoropropylene oligomer in parts by mass.

Comparative Example 8

The comparative example is basically the same as embodiment 1 except that the composition in the present comparative example includes 30 parts of 1-naphthol arylalkyl epoxy resin, 10 parts of bisphenol-F/A copolymerized epoxy resin, 1 part of N-[2-methyl-4-(oxiranylmethoxy)phenyl]-N-(oxiranylmethyl)oxiranemethanamine, 25 parts of 1-hydroxynaphthyl aralkyl resin, 1 part of triphenylphosphine, 2 parts of carbon black, 32 parts of spherical silica and 0.2 part of modified hexafluoropropylene oligomer in parts by mass.

The intersolubility between the composition in each of embodiments 1 to 7 and comparative examples 1 to 8 and PMA is observed. If the viscosity of the composition is rapidly increased to be in a gel state during test, the intersolubility of PMA is poor. Intersolubility results refer to table 1.

A surface tension test is performed on the composition in each of embodiments 1 to 7 and comparative examples 1 to 8, and test results refer to table 1.

The adhesive film in each of embodiments 1 to 7 and comparative examples 1 to 8 is cured at 150° C. for 1 h to obtain the chip protection film, and the chip protection film is cut to obtain a sample. A glass transition temperature test, a thermal expansion coefficient test, a silver-coated silicon wafer adhesion test, a cross-cut adhesion test and an alkali resistance test are performed on the sample, and test results refer to table 1.

The surface tension test: a detected sample is added into a crystallizing dish by adopting a platinum plate method, and a platinum plate is hung up to ensure that the platinum plate is parallel to a surface of the tested sample; and a platinum plate method option on a control screen is selected to start measurement, and the highest tension value is read after a tension is stable;

the glass transition temperature test: the cured, sample is tested according to ASTM E2254-2018 standard, wherein the prepared test sample has a length of 55 mm, a width of 10 mm and a height of 2 mm, a measurement mode is a dual cantilever mode, a vibration frequency is 1 Hz, an amplitude is 10 μm, and a temperature rise rate is 3° C./min;

the thermal expansion coefficient test: the sample is tested according to ASTM E831-2019 standard, and the prepared test sample has a length of 5 mm, a width of 5 mm and a height of 2 mm. A thermal expansion coefficient of the sample is tested in a TMA (compression mode), and test parameters are shown as follows: a preloading force: 0.05N, first scanning: the room temperature is raised to 250° C. (the temperature rise rate is 10° C./min), and second scanning:

a silver-coated silicon wafer and is cured at 150° C. for 1 h to obtain a chip protection film, and then, ultrasonic vibration is preformed according to the following conditions: 1, ultrasonic vibration is performed in a solvent, i.e. a mixed solution (WS2000B) of diethylene glycol monoethyl ether and 5% of KOH, wherein a mass ratio of diethylene glycol monoethyl ether to KOH is 50%, a temperature is 60° C., a frequency is 40 KHz, and the time is 15 min/30 min; and 2, ultrasonic vibration is performed in pure water, a temperature is 55° C., a frequency is 4 KHz, and the time is 28 min. The chip protection film is dried at 70° C. for 14 min after ultrasonic vibration. The weight loss percentage before, and after etching by an alkaline solution is calculated, and it is observed whether the chip protection film falls off.

TABLE 1

| Intersolubility | | Surface tension (mN/m) | Glass transition temperature (° C.) | Thermal expansion coefficient (ppm/° C.) | Silver-coated silicon wafer adhesion (MPa) | Cross-cut adhesion (number) | | | Alkali resistance (weight loss percentage %/fall off or not) | |
|---|---|---|---|---|---|---|---|---|---|---|
| | | | | | | 0 h | 96 h | 168 h | 15 min | 30 min |
| Embodiment 1 | good | 15 | 162 | 46/94 | 24 | 0 | 0 | 1 | 0.48/N | 2.9/N |
| Embodiment 2 | good | 12 | 163 | 44/96 | 28 | 0 | 0 | 0 | 3.2/N | 0.48/N |
| Embodiment 3 | good | 14 | 163 | 47/93 | 22 | 0 | 1 | 1 | 0.51/N | 3.2/N |
| Embodiment 4 | good | 12 | 161 | 45/96 | 24 | 0 | 0 | 1 | 3.6/N | 0.51/N |
| Embodiment 5 | good | 16 | 162 | 49/96 | 23 | 0 | 1 | 1 | 3.0/N | 3.6/N |
| Embodiment 6 | good | 13 | 166 | 43/91 | 21 | 0 | 0 | 1 | 2.2/N | 3.0/N |
| Embodiment 7 | good | 14 | 172 | 45/93 | 26 | 0 | 0 | 0 | 16.8/Y | 2.2/N |
| Comparative example 1 | good | 21 | 165 | 46/96 | 17 | 0 | 3 | 4 | 25.4/Y | 16.8/Y |
| Comparative example 2 | good | 24 | 160 | 49/97 | 19 | 0 | 2 | 3 | 14.1/Y | 25.4/Y |
| Comparative example 3 | good | 18 | 163 | 48/91 | 16 | 0 | 0 | 1 | 18.9/Y | 14.1/Y |
| Comparative example 4 | good | 24 | 155 | 43/86 | 15 | 0 | 2 | 4 | 19.2/Y | 18.9/Y |
| Comparative example 5 | good | 23 | 161 | 48/99 | 18 | 0 | 1 | 3 | 5.8/Y | 19.2/Y |
| Comparative example 6 | good | 18 | 164 | 43/92 | 21 | 0 | 0 | 1 | NA | 5.8/Y |
| Comparative example 7 | good | NA | NA | NA | NA | NA | NA | NA | 5.9/Y | NA |
| Comparative example 8 | good | 19 | 162 | 48/98 | 21 | 0 | 1 | 1 | 4.6/Y | 5.9/Y |
| Comparative example 9 | good | 16 | 168 | 41/90 | 24 | 0 | 0 | 1 | 2.9/N | 4.6/Y |

Wherein NA represents no detection,
Y represents that the chip protection film falls off, and
N represents that the chip protection film does not fall off.

the room temperature is raised to 250° C. (the temperature rise rate is 10° C./min), and curve data on a second temperature rise segment is acquired;

the silver-coated silicon wafer adhesion test: an adhesive film having a length of 5 mm, a width of 5 mm and a thickness of 40 μm is transferred and stuck to a silver-coated silicon wafer and is cured at 150° C. for 1 h to obtain a chip protection film, and the maximum shear bonding strength of the chip protection film is tested by using a universal tensile tester (at a speed of 1 mm/min).

the cross-cut adhesion test the cured sample is tested according to ASTM D3359-97 standard, an adhesive film having a length of 10 cm, a width of 10 cm and a thickness of 40 um, is transferred and stuck to a silver-coated silicon wafer and is cured at 150° C. for 1 h to obtain a chip protection film, a pressure cooker cross-cut adhesion test is performed for 0 h, 96 h and 168 h, then, the adhesive film is uniformly scratched and cut by using a cross-cut tester, and the number of fallen cross cuts is recorded: and the alkali resistance test: an adhesive film having a length of 10 mm and a width of 1 mm is transferred and stuck to Wherein NA represents no detection, Y represents that the chip protection film fills off, and N represents that the chip protection film does not fall off.

It can be known from table 1 that:

the composition in the present application has good PMA intersolubility, glass transition temperature and thermal expansion coefficient;

compared with the composition in each of comparative examples 1 to 7, the composition in each of embodiments 1 to 7 has lower surface tension;

compared with the composition in each of comparative examples 1 to 7, the chip protection film prepared from the composition in each of embodiments 1 to 7 has higher sliver-coated silicon wafer adhesion;

compared with the composition in each of comparative examples 1 to 2 and comparative examples 4 to 5, the chip protection film prepared from the composition in each of embodiments 1 to 7 has strong cross-cut adhesion;

compared with the composition in each of comparative examples 1 to 8, the chip protection film prepared from the composition in each of embodiments 1 to 7 is lower in weight loss percentage after being etched by the alkaline solution and does not fall off;

in comparative example 4, due to the exclusion of N-[2-methyl-4-(oxiranylmethoxy)phenyl]-N-(oxiranylmethyl) oxiranemethanamine, the glass transition temperature of the composition is lower;

in comparative examples 7 to 8, due to excessively low content of the modified hexafluoropropylene oligomer, the chip protection film falls off and in comparative example 6, due to the poor intersolubility between the composition and PMA, the formed film does not reach the standard, and the surface tension, the glass transition temperature, the thermal expansion coefficient, the silver-coated silicon wafer adhesion, the cross-cut adhesion, the weight loss percentage after etching by the alkaline solution and the determination whether the chip protection film falls off cannot be detected.

The composition, the adhesive film including the composition and the chip packaging structure provided in the embodiments of the present application have been introduced in detail as above. Specific individual examples are applied herein to describe the principle and implementations of the present application. The descriptions of the above-mentioned embodiments are only intended to help understand the method and core concept of the present application. At the same time, those skilled in the art may, based on the concept of the present application, make modifications with respect to the specific implementations and the application scope. In conclusion, the content of this specification shall not be understood as a limitation on the present application.

What is claimed is:

1. A composition, wherein the composition comprises epoxy resin, a surfactant, a curing agent and filler, the surfactant is selected from a modified hexafluoropropylene compound, the composition contains 40-70 parts of the epoxy resin, 0.25-1.9 parts of the surfactant, 15-35 parts of the curing agent and 30-50 parts of the filler, the epoxy resin consists of naphthol epoxy resin, bisphenol epoxy resin and N-[2-methyl-4-(oxiranylmethoxy)phenyl]-N-(oxiranylmethyl)oxiranemethanamine, wherein the composition contains 25-40 parts of the naphthol epoxy resin, 10-20 parts of the bisphenol epoxy resin and 5-10 parts of N-[2-methyl-4-(oxiranylmethoxy)phenyl]-N-(oxiranylmethyl)oxiranemethanamine.

2. The composition of claim 1, wherein the modified hexafluoropropylene compound comprises at least one of a modified hexafluoropropylene oligomer and polyoxyethylene ether modified hexafluoropropylene.

3. The composition of claim 1, wherein the naphthol epoxy resin comprises at least one of 1-naphthol arylalkyl epoxy resin and 1,6-naphthol arylalkyl epoxy resin;

the 1-naphthol arylalkyl epoxy resin has a structural formula shown as follows:

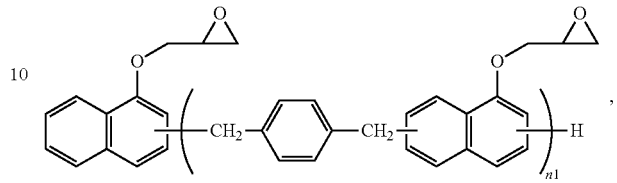

the 1,6-naphthol arylalkyl epoxy resin has a structural formula shown as follows:

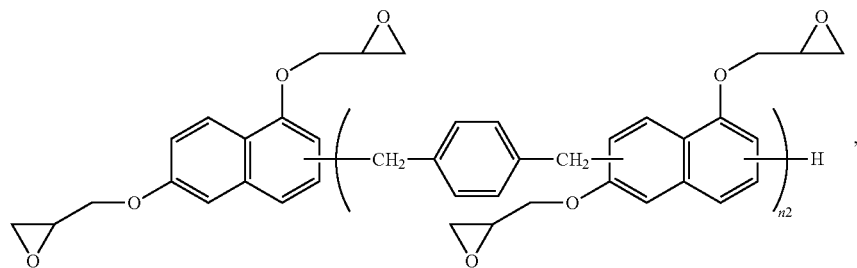

wherein n1 is an integer greater than or equal to 5 and less than or equal to 10, and n2 is an integer greater than or equal to 5 and less than or equal to 10.

4. The composition of claim 1, wherein the bisphenol epoxy resin comprises at least one of bisphenol-F epoxy resin, bisphenol-A epoxy resin, bisphenol-F/A copolymerized epoxy resin and bisphenol-S epoxy resin.

5. The composition of claim 1, wherein the curing agent comprises at least one of 1-hydroxynaphthyl aralkyl resin and 1,6-dihydroxynaphthyl aralkyl resin;

the 1-hydroxynaphthyl aralkyl resin has a structural formula shown as follows:

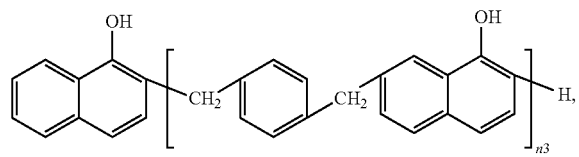

the 1 6-dihydroxynaphthyl aralkyl resin has a structural formula shown as follows:

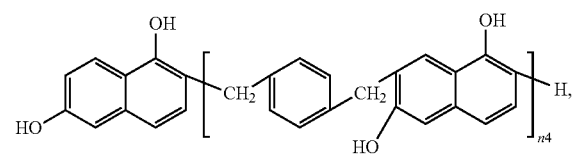

wherein n3 is an integer greater than or equal to 5 and less than or equal to 10, and n4 is an integer greater than or equal to 5 and less than or equal to 10.

6. The composition of claim 1, wherein the filler comprises at least one of silica, calcium carbonate, aluminum oxide and diatomite.

7. The composition of claim 1, wherein the composition further comprises an accelerator, and the composition contains 0.5-5 parts of the accelerator in parts by mass; and/or the composition further comprises a colorant, and the composition contains 1-5 parts of the colorant in parts by mass; and/or the composition further comprises a solvent, and the composition contains 85-170 parts of the solvent in parts by mass.

8. The composition of claim 7, wherein the accelerator comprises at least one of boron trifluoride triethylphosphine, boron trifluoride triisopropylphosphine, cyclotriphosphine, a phosphoramine compound, triethylphosphine, triphenylphosphine and derivatives thereof; and/or the colorant is selected from carbon black; and/or the solvent is selected from at least one, of propylene glycol nonamethyl ether acetate, ethyl acetate, butyl acetate, cyclohexanone, methyl isobutyl ketone and diethylene glycol monoethyl ether.

9. An adhesive film, wherein the adhesive film comprises the composition of claim 1, or the adhesive film is prepared from the composition of claim 1.

10. A chip packaging structure, comprising a chip and a chip protection film combined to one surface of the chip, wherein the chip protection film is formed after the composition of claim 1 is cured, or the chip protection film is formed after the adhesive film of claim 9 is cured.

11. The chip packaging structure of claim 10, wherein the chip comprises a substrate and a silver layer located on one surface of the substrate, and the chip protection film is combined to a surface, away from the substrate, of the silver layer.

* * * * *